//(12) United States Patent
Bloomquist et al.

(10) Patent No.: US 6,906,947 B2
(45) Date of Patent: Jun. 14, 2005

(54) IN-PLANE TOROIDAL MEMORY CELL WITH VERTICALLY STEPPED CONDUCTORS

(75) Inventors: Darrel R. Bloomquist, deceased, late of Meridian, CA (US); by Judy Bloomquist, legal representative, Meridian, ID (US); Anthony Peter Holden, Boise, ID (US); Manoj K. Bhattacharyya, Cupertino, CA (US); Thomas C. Anthony, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 285 days.

(21) Appl. No.: 10/080,847

(22) Filed: Feb. 22, 2002

(65) Prior Publication Data

US 2003/0161179 A1 Aug. 28, 2003

(51) Int. Cl.$^7$ ................................................ G11C 11/00
(52) U.S. Cl. ......................................... 365/158; 365/63
(58) Field of Search .................................. 365/158, 63

(56) References Cited

U.S. PATENT DOCUMENTS

| | | | | |
|---|---|---|---|---|
| 3,599,187 A | * | 8/1971 | Bobeck et al. | 365/138 |
| 4,328,564 A | * | 5/1982 | Pryor | 365/130 |
| 4,903,343 A | * | 2/1990 | Cope et al. | 365/91 |
| 5,587,943 A | * | 12/1996 | Torok et al. | 365/158 |
| 6,266,289 B1 | * | 7/2001 | Dubovik et al. | 365/56 |

OTHER PUBLICATIONS

Jimmy Zhu and Gary A. Prinz, "VMRAM Memory Holds Both Promise and Challenges", DATA Storage, Sep. 2000, 8 pgs.

* cited by examiner

Primary Examiner—Richard Elms
Assistant Examiner—Tuan T. Nguyen

(57) ABSTRACT

A magnetic random access memory device uses toroid-like magnetic memory cells. An axial opening extends through each of the memory cells and is generally aligned along a first axis. A first conductor and a second conductor pass through the axial opening of each memory cell and are generally aligned with the first axis.

14 Claims, 5 Drawing Sheets

IN-PLANE TOROIDAL MEMORY CELL WITH VERTICALLY STEPPED CONDUCTORS

THE FIELD OF THE INVENTION

The present invention generally relates to magnetic random access memory (MRAM) devices, and more particularly to a magnetic random access memory device using memory cells having a toroidal shape.

BACKGROUND OF THE INVENTION

An MRAM device includes an array of memory cells. The typical magnetic memory cell includes a layer of magnetic film in which the magnetization is alterable and a layer of magnetic film in which the magnetization is fixed or "pinned" in a particular direction. The magnetic film having alterable magnetization may be referred to as a data storage layer or sense layer and the magnetic film which is pinned may be referred to as a reference layer.

Conductive traces (commonly referred to as word lines and bit lines) are routed across the array of memory cells. Word lines extend along rows of memory cells, and bit lines extend along columns of memory cells. Because the word lines and bit lines operate in combination to switch the orientation of magnetization of the selected memory cell (i.e., to write the memory cell) the word lines and bit lines can be collectively referred to as write lines. Additionally, the write lines can also be used to read the logic values stored in the memory cell.

Located at each intersection of a word line and a bit line is a memory cell. Each memory cell stores a bit of information as an orientation of a magnetization. External magnetic fields are applied to flip the orientation of magnetization in the data storage layer with respect to the orientation of magnetization in the reference layer, depending on the desired logic state (i.e., "1" or "0").

The orientation of magnetization of each memory cell will assume one of two stable orientations at any given time. These two stable orientations represent logic values of "1" and "0". The orientation of magnetization of a selected memory cell may be changed by supplying current to a word line and a bit line which intersect at the selected memory cell. The currents create magnetic fields that, when combined, can switch the orientation of magnetization (and thus the logic value) of the selected memory cell. Since no electric power is needed to maintain the memory state of the device, MRAM's are non-volatile.

A selected magnetic memory cell is usually written by applying electrical currents to the particular word and bit lines that intersect the selected magnetic memory cell. The electrical currents create a corresponding magnetic field (a "write field") about the energized word and bit lines. Preferably, only the selected magnetic memory cell receives both the word and bit line write fields. Other memory cells coupled to the particular word line preferably receive only the word line write field. Other magnetic memory cells coupled to the bit line preferably receive only the bit line write field.

The magnitudes of the word and bit line write fields are usually selected to be high enough so that the chosen magnetic memory cell switches its logic state when subjected to both fields, but low enough so that the other magnetic memory cells which are subject only to a single write field (from either the word line or the bit line) do not switch. The undesirable switching of a magnetic memory cell that receives only one write field is commonly referred to as "half-select" switching.

In MRAM designs having memory cells with shapes other than a toroidal shape (e.g., rectangular shapes), the magnetic moment in the memory cell is linearly oriented. The primary problem of linear magnetization orientations is the stray field (outside of the magnetic elements of the memory cell) and the demagnetization field (within the magnetic elements of the memory cell) generated from the magnetic poles formed at the end of the memory cell. If the ends of the magnetic elements are flat, the strong demagnetization field can cause the formation of complicated edge domains and thereby cause the switching threshold of the magnetic moment to fluctuate uncontrollably. Therefore, in practice, the ends of the memory cells are preferably tapered into sharp tips to eliminate or reduce edge domains.

The preference for sharp ends in the memory cells may force the size of the memory cell to be much larger than the critical dimension of the fabrication technology used to make the device. Shape variations of the tapered ends from element to element (such as due to a fabrication process variation) could yield variations of the switching field, thereby degrading the capability of the memory cell. In addition, even tapered ends may generate a stray magnetic field which could interfere with adjacent memory cells in an array, thereby limiting the packing density of the memory cells.

The memory element in the MRAM device of the present invention is a toroid-shaped stack having a sense layer and a pinned reference layer separated by an insulator. Toroid-shaped memory elements are previously known, and offer several advantages. The circular magnetization mode of the toriodal shaped memory cell provides a stable magnetic configuration which produces no stray fields and no demagnetization field. Thus, the toroid-shaped memory cell has an advantage in that it may be placed in higher densities in an array, and can be manufactured in sized closer to the critical dimensions allowed by the fabrication technology.

The toroidal shape of the memory cell results in a circular orientation of the magnetization, either clockwise or counterclockwise. The magnetization orientation of the sense layer of the memory cell may be switched either from clockwise to counter-clockwise or vice versa. A current pulse in a conductor extending over or under the memory cell generates a radial magnetic field, rotating the magnetization in the sense layer in the radial direction. A current pulse in a conductor extending through the axial opening of the toroid-shaped sense layer generates an angular (or circular) magnetic field, switching the magnetization into the new circular orientation. When the magnetization orientations of the pinned layer and the sense layer of the memory cell have the same directional orientation, the resistance of the memory cell is low (corresponding, for example, to a logic "1"). When the pinned layer and the sense layer have magnetization orientations in opposite directions, the resistance of memory cell is high (corresponding, for example, to a logic "0").

Although toroid-like memory cells provide advantages over linearly oriented memory cells, as discussed above, is still desirable to reduce the power consumption in the MRAM device using toroid-like memory cells by reducing the magnitude of the write currents necessary to rotate the orientation of magnetization of the data storage layer during write operations to the memory cell. For example, reduced power can result in a reduction in the waste heat generated by electronic devices incorporating the MRAM device. Moreover, for portable devices, is desirable to reduce power consumption to extend battery life.

SUMMARY OF THE INVENTION

The present invention is a magnetic random access memory device using toroid-like magnetic memory cells. In one embodiment, the magnetic memory cell includes a data storage layer and a reference layer. An axial opening extends through each of the memory cells and is generally aligned along a first axis. A first conductor and a second conductor pass through the axial opening of the memory cell and are generally aligned with the first axis.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
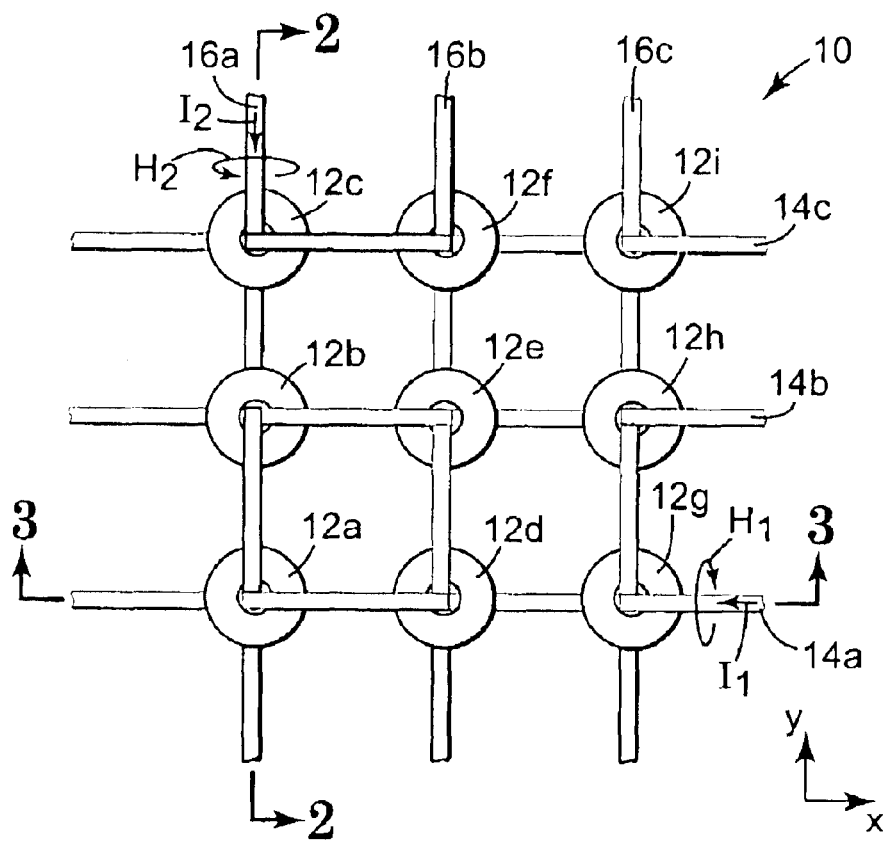
FIG. 1 is a plan view of an MRAM device illustrating one embodiment of the present invention.
Figure 2:
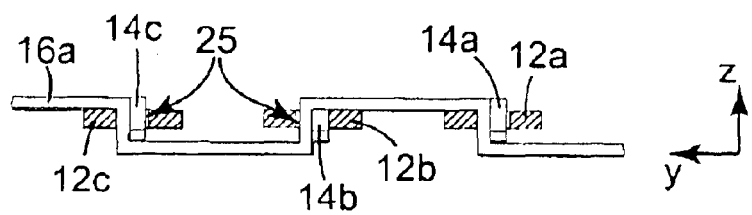
FIG. 2 is an elevational view taken along line 2—2 of FIG. 1.
Figure 3:
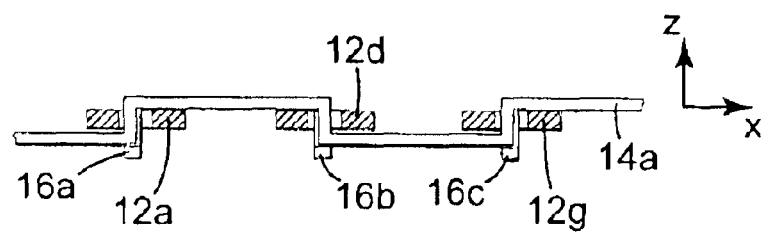
FIG. 3 is an elevational view taken along line 3—3 of FIG. 1.

FIGS. 1, 2 and 3 illustrate plan and elevational views, respectively, of one embodiment of the inventive MRAM device using in-plane toroid-like memory cells with vertically stepped conductors. In the example of FIGS. 1–3, MRAM device 10 includes an array of toroid-like memory cells 12a, 12b, 12c, 12d, 12e, 12f, 12g, 12h, 12i (collectively referred to herein as memory cells 12). It is understood that any number of memory cells could be present in the array of MRAM device 10, and FIGS. 1, 2 and 3 are exemplary only. MRAM device 10 also includes an array of word conductors 14a, 14b, 14c and bit conductors 16a, 16b, 16c (collectively referred to herein as word conductors 14 and bit conductors 16, respectively) that enable read and write access to the magnetic memory cells 12.

Also shown in FIGS. 1, 2 and 3 is a set of x-y-z axes that will be useful in describing the relative orientations of the word conductors 14 and bit conductors 16 to the magnetic memory cells 12, and the relative orientations of magnetic fields applied to the magnetic memory cells 12 during write operations.

Figure 4:
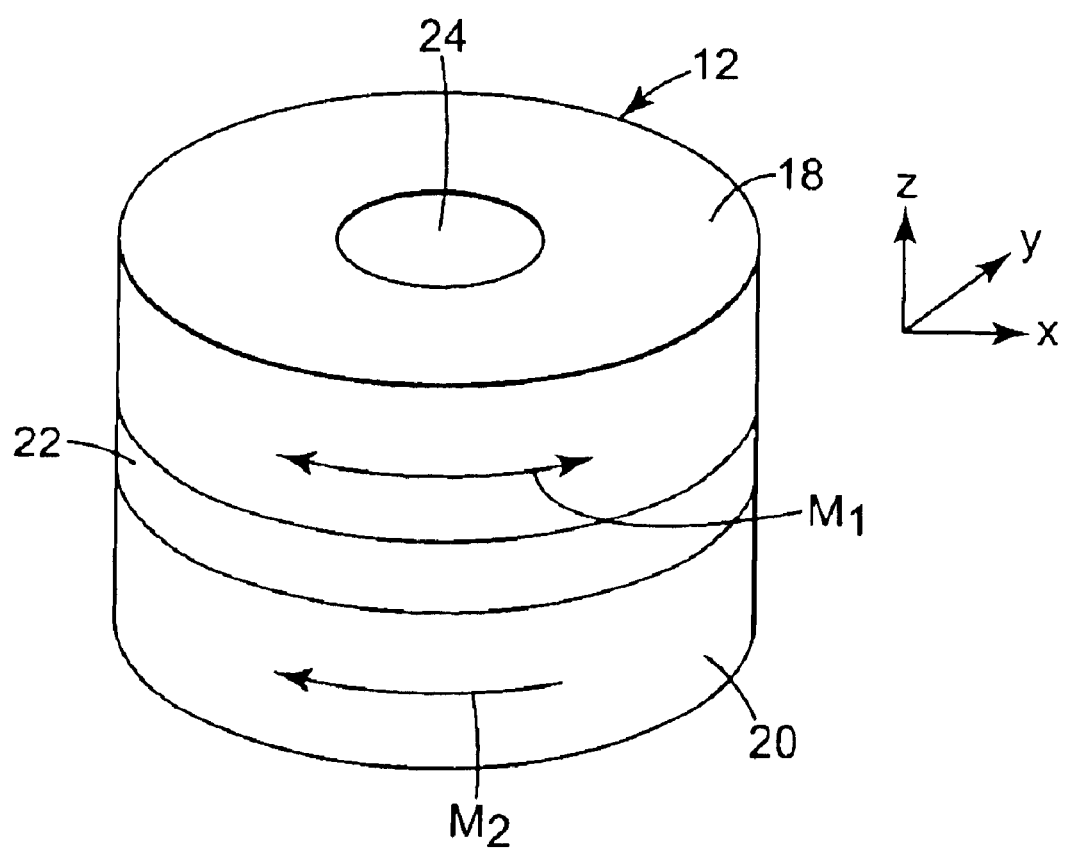
FIG. 4 is a perspective view of a toroid-like memory cell used in one embodiment of the present invention.

In one embodiment illustrated in FIG. 4, the toroid-like magnetic memory cells 12 each include a magnetic film which functions as a data storage layer 18, a magnetic film which functions as a reference layer 20, and a tunnel barrier 22 between the data storage layer 18 and the reference layer 20. An axial opening 24 extends through the data storage layer 18, reference layer 20, and tunnel barrier 22. Axial opening 24 is generally aligned with the z-axis.

Figure 5A:
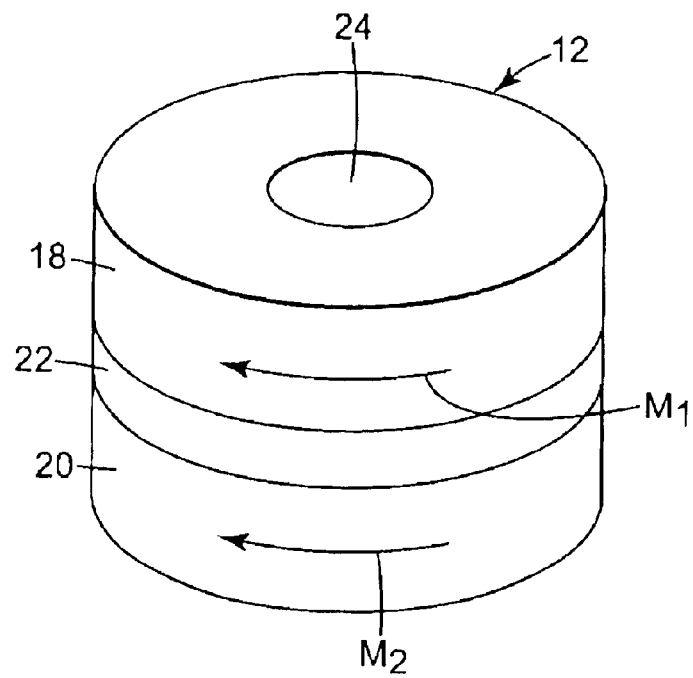
FIGS. 5a and 5b are side views of a toroid-like memory cell showing alternate magnetization orientations of the active and reference magnetic films.
Figure 5B:
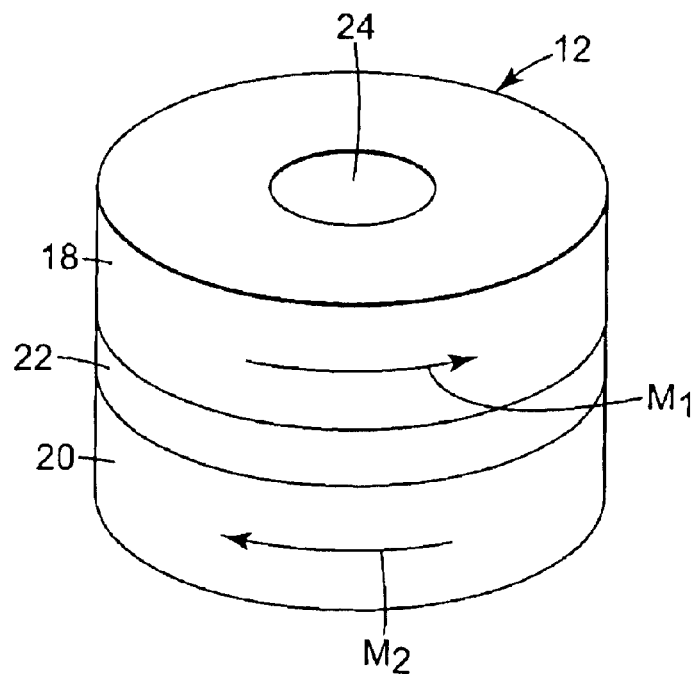

The orientation of magnetization in the data storage layer 18 is not fixed and can assume two stable orientations as shown by arrow $M_1$. On the other hand, the reference layer 20 has a pinned or fixed orientation of magnetization as shown by arrow $M_2$. Data storage layer 18 rotates its orientation of magnetization in response to electrical currents applied to the word conductors 14 and bit conductors 16 during a write operation to the memory cells 12. A first logic state of the data bit stored in memory cell 12 is indicated when $M_1$ and $M_2$ are oriented in the same direction, as illustrated in FIG. 5a. For instance, when $M_1$ and $M_2$ are parallel a logic "1" state is stored in the memory cells 12. Conversely, a second logic state is indicated when $M_1$ and $M_2$ are oriented in opposite directions as illustrated in FIG. 5b. When $M_1$ and $M_2$ are oriented in opposite directions, a logic state "0" is stored in memory cell 12.

The structure of the magnetic memory cells 12 described above may be referred to as a spin tunneling device in that an electrical charge migrates through the tunnel barrier 22 during read operations. This electrical charge migration through the tunnel barrier 22 is due to a phenomenon known as spin tunneling and occurs when a read voltage is applied to the magnetic memory cells 12. In an alternative embodiment, a giant magnetoresistive (GMR) structure may be used in the magnetic memory cells 12.

As seen in FIGS. 1–3, word conductors 14 are formed so that their general direction of orientation is substantially aligned with the x-axis, while the bit conductors 16 are formed so that their general direction of orientation is substantially aligned with the y-axis. Thus, the word conductors 14 and bit conductors 16 extend in generally orthogonal directions. In addition, word conductors 14 and bit conductors 16 are each formed so that they have a "stepped" portion 25 which extends through the axial opening 24 of magnetic memory cells 12. As best illustrated in FIGS. 2 and 3, word conductors 14 and bit conductors 16 thus have a vertically stepped construction (that is, they are stepped in the z direction) as they extend in the x and y directions, respectively. At the stepped portions 25, word conductors 14 and bit conductors 16 both extend along the z-axis and are substantially parallel to each other as they pass through the axial openings 24 of the memory cells 12.

Figure 6:
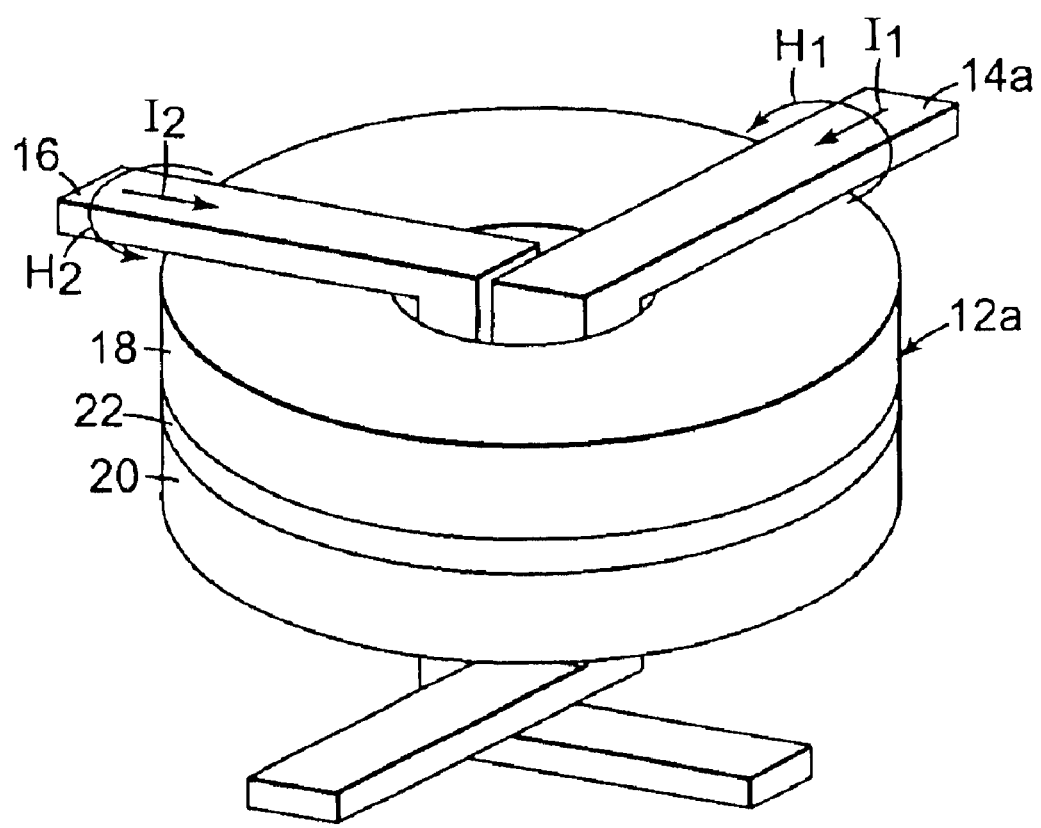
FIG. 6 is a greatly enlarged perspective view of one of the memory cells and pair of conductors in FIG. 1.

The logic states of the magnetic memory cells 12 are manipulated by applying electrical currents to the word conductors 14 and bit conductors 16. For example, as shown in FIGS. 1 and 6, magnetic memory cell 12a is written by applying electrical currents $I_1$ and $I_2$ to word conductor 14a and bit conductor 16a, respectively, which intersect magnetic memory cell 12a. The electrical current $I_1$ applied to word conductor 14a in one direction causes a magnetic field $H_1$ in the magnetic memory cell 12a according to the right-hand rule. The electrical current $I_1$ in word conductor 14a also causes an $H_1$ field in magnetic memory cells 12d and 12g. Similarly, the electrical current $I_2$ applied to bit conductor 16a in one direction causes a magnetic field $H_2$ in the magnetic memory cells 12a, 12b and 12c according to the right hand rule The angle of orientation of word conductor 14a and bit conductor 16a with respect to the data storage layer 18 of memory cell 12a is such that the full strength of magnetic fields $H_1$ and $H_2$ are both aligned with the circular magnetic field $M_1$ of the data storage layer 18. This allows the fields $H_1$ and $H_2$ in the (non-selected) magnetic memory cells 12b, 12c, 12d and 12g to be well below the strength needed to rotate the orientation of magnetization M1 of those magnetic memory cells. The possibility of inadvertent half-select switching of magnetic memory cells 12b, 12c, 12d and 12g is thereby reduced.

Figure 7:
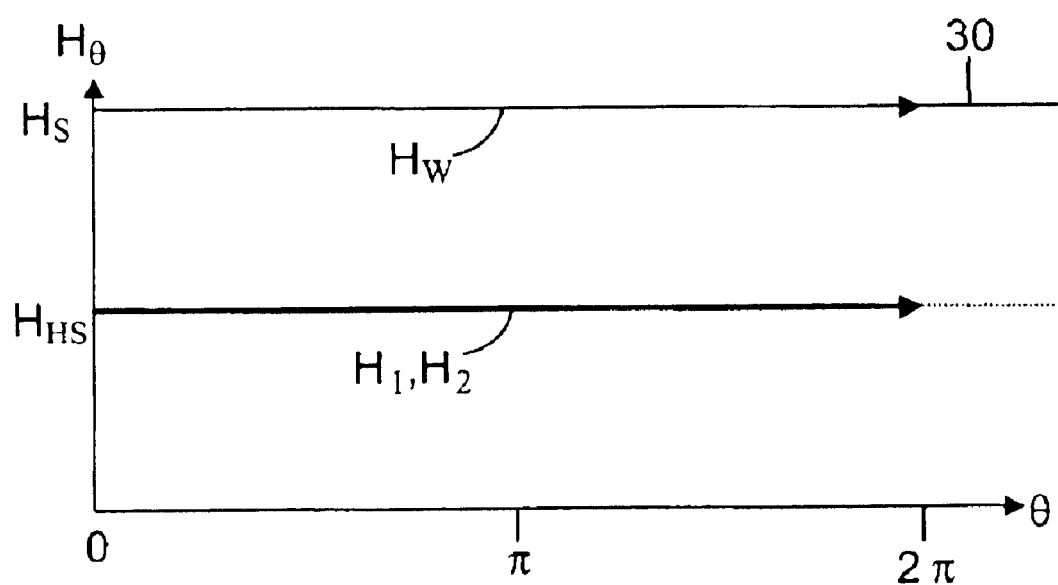
FIG. 7 shows the relationship between the $H_1$ and $H_2$ magnetic fields and the switching characteristics of the data storage layer of a magnetic memory cell.

FIG. 7 shows the relationship between the $H_1$ and $H_2$ fields and the switching field of the data storage layer 18 of the magnetic memory cell 12a. In FIG. 7, the horizontal axis θ represents the angular position in the data storage layer, while the vertical axis $H_θ$ represents the magnitude of the circumferential component of the magnetic field in the data storage layer.

As described above, the orientations of $H_1$ and $H_2$ are substantially aligned with the circular orientation of $M_1$ in the data storage layer 18 of memory cell 12a. Thus, the vectors $H_1$ and $H_2$ are in parallel alignment with respect to the angular axis θ. The magnitude of the vectors $H_1$ and $H_2$ are illustrated by the distance $H_1$ and $H_2$ are positioned above the angular axis θ. In this illustration, $H_1$ and $H_2$ are shown to have the same magnitude, although this is not required. A vector $H_W$ represents a vector which results from a combination of the $H_1$ and $H_2$ vectors.

The line 30 represents a theoretical switching field for the data storage layer 18 of the magnetic memory cell 12a. The line 30 shows that a circumferential magnetic field having a minimum magnitude equal to $H_S$ is needed to flip the orientation of magnetization in the data storage layer of the magnetic memory cell 12a between the positive and negative angular directions.

The magnitudes of the $H_1$ and $H_2$ fields are pre-selected so that the resulting field $H_W$ has a magnitude that is greater than or equal to the magnitude $H_S$ needed to write to the magnetic memory cell 12a. In FIG. 7, the magnitude of $H_W$ is shown to equal $H_S$. For example, if $H_1$ and $H_2$ are such that $H_W$ has a magnitude equal to the magnitude $H_S$, and $H_1$ and $H_2$ each have a circumferential component with a magnitude $H_{HS}$ equal to $H_S/2$, then the magnetic memory cells 12b, 12c, 12d and 12g are each subject to a writing field equal to $H_S/2$ in the circumferential direction during write operations to the magnetic memory cell 12a. This is equivalent to a 100 percent half-select margin. It may be preferable that the magnitudes of the $H_1$ and $H_2$ fields be slightly larger than necessary to yield the $H_W$ field to provide a suitable write margin.

In practice, the switching field represented by the line 30 vary among the magnetic memory cells 12 due to manufacturing variations. In addition, the switching characteristics of memory cells may be such that lower magnitudes of the $H_1$ or $H_2$ fields can cause switching in the magnetic memory cells 12b, 12c, 12d and 12g in the presence of a radial field. This may be due to a variety of factors. For example, there may be manufacturing variations in the crystalline anisotropy value (Hk) of the data storage layer 18. In addition, there may be variations in the thickness or shape of the magnetic layers of the magnetic memory cells 12.

The MRAM array described herein provides improved half-select margins and reduces power consumption in the MRAM memory cell by reducing the magnitude of the write currents necessary to rotate the orientation of magnetization of the data storage layer during write operations to the memory cell.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electromechanical, and electrical, arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents and thereof.

What is claimed is:

1. A write conductor layout for a magnetic random access memory device comprising:
    a toroid-like memory cell having an axial opening aligned with a first axis;
    a first conductor passing through the axial opening of the memory cell; and
    a second conductor passing through the axial opening of the memory cell;
    wherein the first and second conductors extend in generally orthogonal directions with respect to each other, and wherein the first and second conductors each have a stepped portion which is aligned with the first axis as they pass through the axial opening of the memory cell.

2. The magnetic random access memory device of claim 1, wherein the memory cell includes a data storage layer.

3. The magnetic random access memory device of claim 1, wherein the memory cell is a spin tunneling device.

4. The magnetic random access memory device of claim 1, wherein the memory cell is a giant magnetoresistive device.

5. The magnetic random access memory device of claim 1, wherein an electrical current applied to the first and second conductors creates first and second magnetic fields, respectively, in the data storage layer of the memory cell.

6. The magnetic random access memory device of claim 5, wherein the presence of the first and second magnetic fields is capable of switching the orientation of magnetization of the memory cell.

7. The magnetic random access memory device of claim 1, wherein the first and second conductors are electrically insulated from each other.

8. A magnetic random access memory device comprising:
    an array of toroid-like memory cells, each of the memory cells having an axial opening generally aligned with a first axis; and
    an array of conductors, a portion of each conductor generally aligned with the first axis
    wherein an electrical current applied to each of a pair of the conductors creates a first magnetic field and a second magnetic field in one of the memory cells that intersects the pair of conductors and creates either the first magnetic field or the second magnetic field in the magnetic memory cells that do not intersect the pair of conductors.

9. The magnetic memory of claim 8, wherein the array of conductors forms intersecting pairs of conductors, and wherein each one of the array of memory cells is positioned at a unique intersection of a pair of the array of conductors.

10. The magnetic memory of claim 8, wherein the first magnetic field and the second magnetic field combine along an angular axis of the toroid-like memory cells to rotate an orientation of magnetization in a data storage layer of the memory cell that intersects the pair of the conductors.

11. The magnetic memory of claim 8, wherein the first magnetic field in the memory cells that do not intersect the pair of conductors is substantially equal to one half of the sum of the first magnetic field and the second magnetic field in the memory cell that intersects the pair of the conductors.

12. The magnetic memory of claim 8, wherein the second magnetic field in the memory cells that do not intersect the pair of the conductors is substantially equal to one half of the sum of the first magnetic field of the second magnetic field of the memory cell that intersects the pair of the conductors.

13. The magnetic memory of claim 9, wherein each conductor of the pairs of intersecting conductors has a principal direction of orientation, and wherein the principal direction of orientation of the conductors of each pair of intersecting conductors are orthogonal to each other.

14. The magnetic memory of claim 13, wherein the pair of intersecting conductors each include a stepped portion where the conductors are in parallel alignment.

* * * * *